United States Patent [19]

Jones et al.

[11] 4,124,199

[45] Nov. 7, 1978

[54] PROCESS AND APPARATUS FOR CASE HARDENING OF FERROUS METAL WORK PIECES

[75] Inventors: William R. Jones, Chalfont; Prem C. Jindal, Feasterville, both of Pa.

[73] Assignee: Abar Corporation, Feasterville, Pa.

[21] Appl. No.: 814,221

[22] Filed: Jul. 11, 1977

[51] Int. Cl.² ............................................. C21D 1/00
[52] U.S. Cl. ..................................... 266/88; 266/250; 266/252; 148/16.5; 148/16.6
[58] Field of Search ...................... 148/16.5, 16.6, 154, 148/157; 266/252, 250, 81, 87, 88, 89; 204/164, 173, 177, 178

[56] References Cited

U.S. PATENT DOCUMENTS

| | | | |
|---|---|---|---|
| 2,025,134 | 12/1935 | Stammberger | 148/16.6 |
| 2,644,109 | 6/1953 | Mulder | 219/131 R |
| 3,228,809 | 1/1966 | Berghaus et al. | 148/16.6 |
| 3,341,371 | 9/1967 | Baumgartner | 148/154 |
| 3,437,784 | 4/1969 | Jones et al. | 219/121 EM |
| 3,513,014 | 5/1970 | Inoue | 204/173 |
| 3,730,863 | 5/1973 | Keller | 148/16.6 |
| 3,871,630 | 3/1975 | Wanetzky et al. | 266/250 |

*Primary Examiner*—Gerald A. Dost
*Attorney, Agent, or Firm*—Zachary T. Wobensmith, 2nd; Zachary T. Wobensmith, III

[57] ABSTRACT

A process and apparatus for case hardening of ferrous metal work pieces is described in which the work pieces to be processed are placed inside a metal vacuum chamber which is evacuated with a mechanical pump and then backfilled with a partial pressure of a gas containing nitrogen, such as nitrogen or ammonia, or a hydrocarbon such as methane, or mixtures thereof. The work pieces to be processed are electrically connected to the negative (cathode) terminal of a D.C. power supply, the positive terminal being connected to the chamber wall and to ground. The power supply is energized and some of the gas is converted to ions. The work pieces are heated to temperatures of approximately 650° to 1100° F for ionitriding or to temperatures of approximately 1650° to 1900° for ion carburizing. The heating is effected at least in part by the ion activity. Auxiliary heating by auxiliary heating units built into the chamber may be effected to reduce the time required to bring the work pieces to the reaction temperature. A nitrided and/or carburized case is formed on the work pieces, the case depth being determined by the material of the work pieces, the time, the temperature, the gas or gases introduced and the reaction pressure. Cooling and/or quenching may be effected by a recirculating gas cooling system associated with the vacuum chamber.

12 Claims, 3 Drawing Figures

PROCESS AND APPARATUS FOR CASE HARDENING OF FERROUS METAL WORK PIECES

BACKGROUND OF THE INVENTION

1. Field of the Invention

This invention relates to case formation on ferrous metals and more particularly to improved processes and apparatus therefor.

2. Brief Description of the Prior Art

It has heretofore been proposed, as described in American Society for Metals, Metals Handbook, Vol. 2, commencing at p. 677, to carburize the surface of a ferrous work piece or to carbonitriding or ion nitride the surface of the work piece to provide a case which may be hardened as the case is formed or which may subsequently be hardened.

Examples of ion nitriding by ionization in a chamber of a nitrogen containing gas are shown in the U.S. Pat. Nos. to Egan, 1,837,256, Berghaus et al., 2,837,654, Keller, 3,761,370, and Jones et al., 3,437,784 and 3,650,930.

The prior systems were particularly subject to arcing if the power input is high, which materially decreased the effectiveness of the process.

In the U.S. Pat. to Jones et al., No. 3,437,784, a power supply is shown which is intended to limit arcing by limiting the current.

None of the processes heretofore employed has proven wholly satisfactory, detrimental factors including excessive time requirements for processing because of slow heating and cooling of the work pieces, excessive power requirements, and breakdown of continuity because of arcing.

SUMMARY OF THE INVENTION

In accordance with the invention improved methods of and apparatus for gas carburizing, carbonitriding, and ion-nitriding are set forth, the work pieces being placed in a metal vacuum chamber which is evacuated by a mechanical pump, and then backfilled with a partial pressure of an ionizable gas or mixture of ionizable gases. The work pieces to be processed are electrically connected to the negative terminal of a D.C. power supply, the positive terminal being connected to the chamber wall and to ground. Energization of the power supply is effective to ionize some of the gas, the work pieces being heated by ion activity and, if desired, by auxiliary heating of the intermediate space of the vacuum chamber, to form a nitrided and/or carburized case, may be effected by the use of the auxiliary heating to shorten the time required or to heat more rapidly work pieces having a large mass. Cooling and/or quenching may be effected by a recirculating gas cooling system associated with the vacuum chamber.

It is the principal object of the present invention to provide simple but effective methods and apparatus for case forming on work pieces in which the time for case formation is shortened.

It is a further object of the present invention to provide simple but effective methods and apparatus for case forming on work pieces in which heating of the environment within a vacuum chamber is effected.

It is a further object of the present invention to provide simple but effective methods and apparatus for case forming on work pieces in which provisions are made for cooling and/or quenching.

If is a further object of the present invention to provide simple but effective methods and apparatus for case forming on work pieces utilizing simple but effective electrical circuitry for ionization.

Other objects and advantageous features of the present invention will be apparent from the description and claims.

BRIEF DESCRIPTION OF THE DRAWINGS

The nature and characteristic features of the invention will be more readily understood from the following description taken in connection with the accompanying drawings forming part hereof in which.

Figure 1:
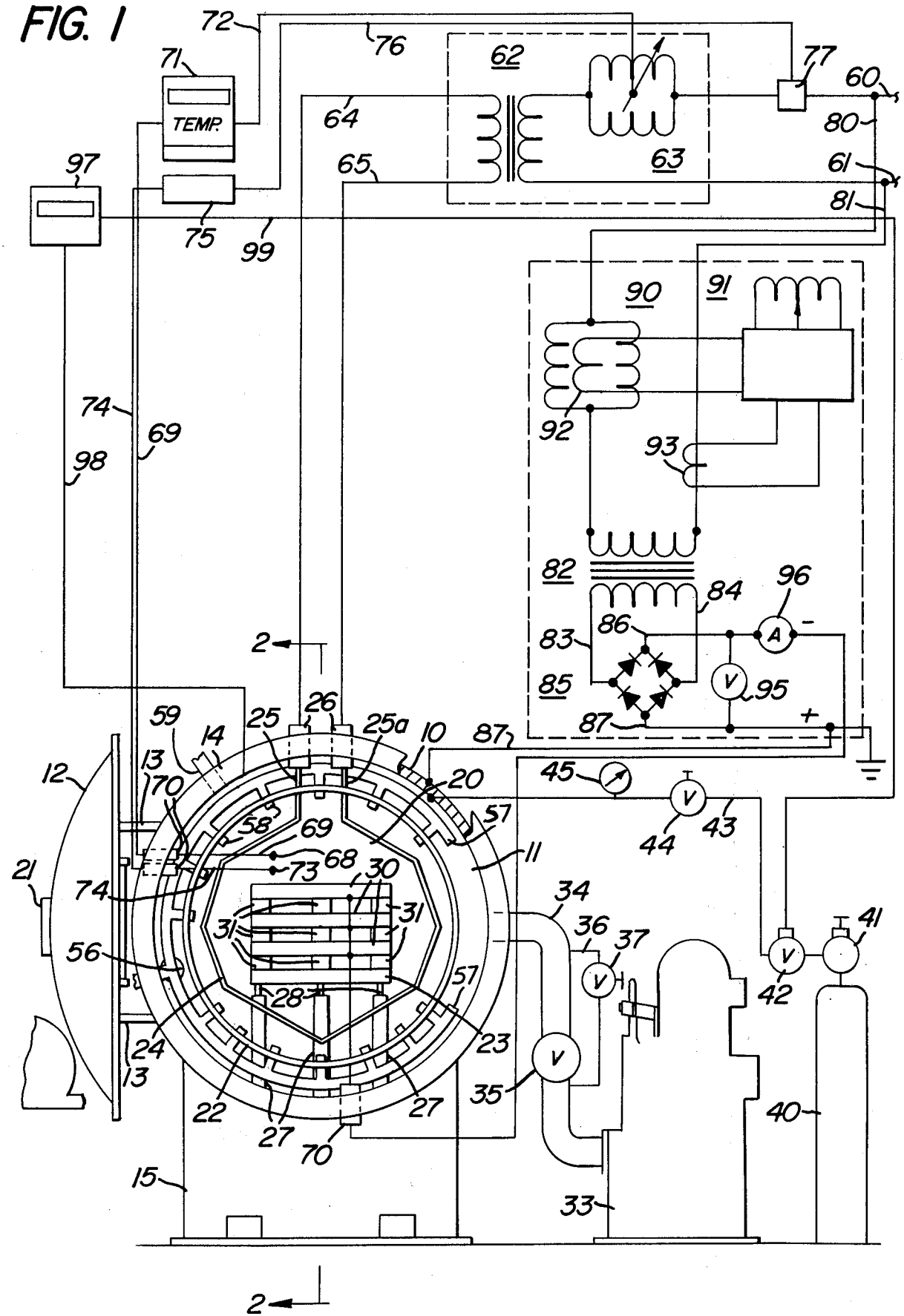
FIG. 1 is a front elevational view of a vacuum chamber and illustrating the electrical circuitry.
Figure 2:
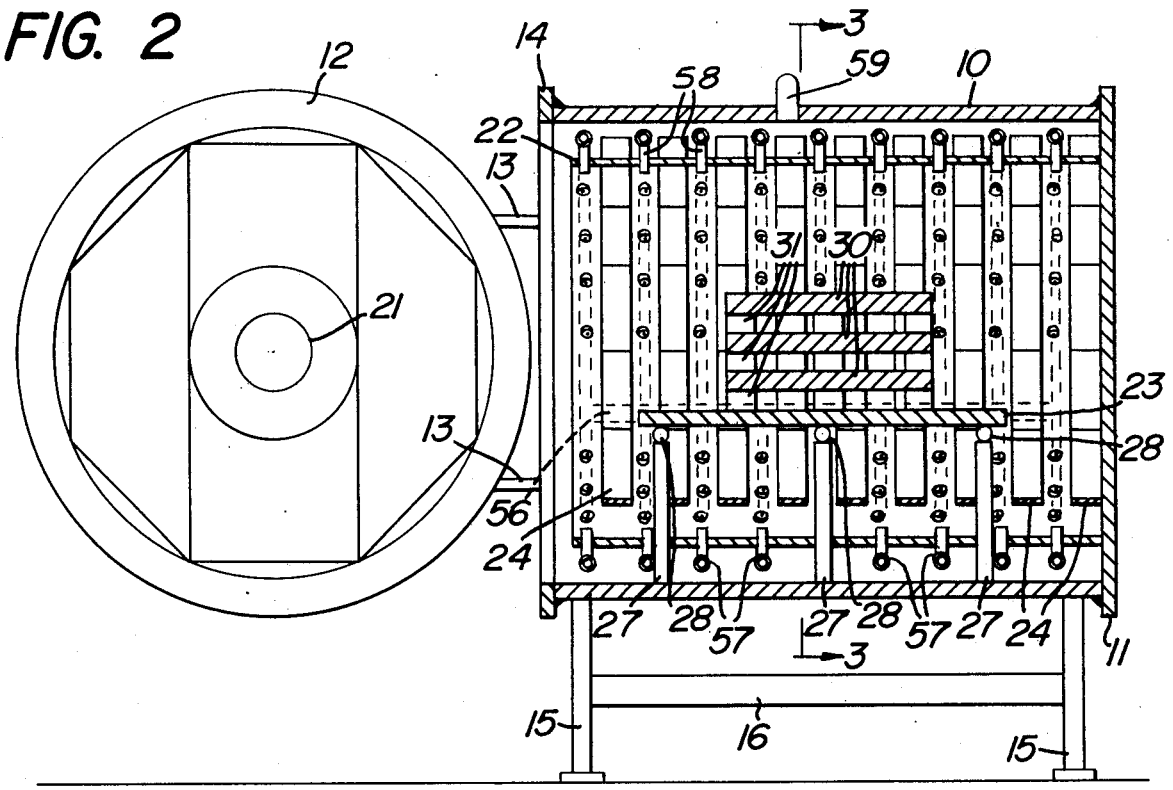
FIG. 2 is a longitudinal sectional view taken approximately on the line 2—2 of FIG. 1.
Figure 3:
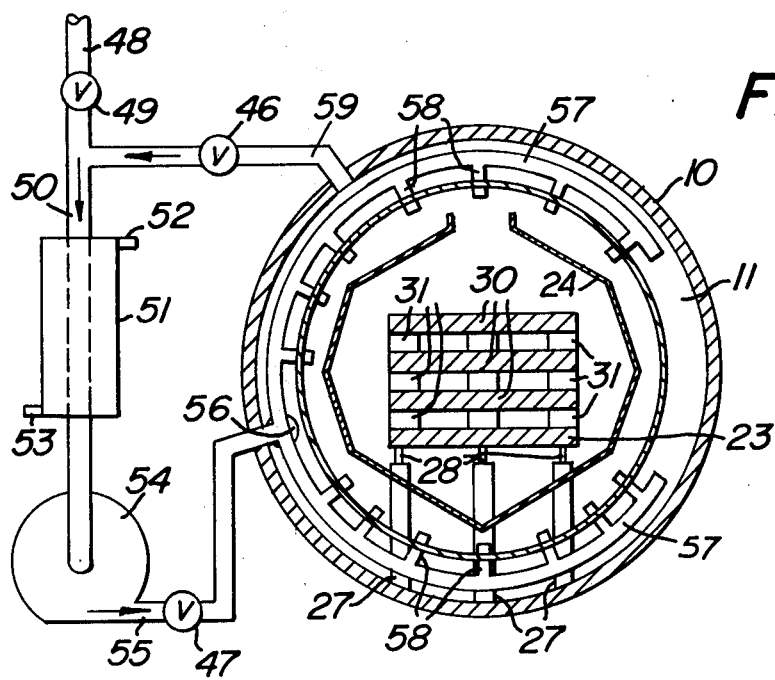
FIG. 3 is a transverse sectional view taken approximately on the line 3—3 of FIG. 2.

It should, of course, be understood that the description and drawings herein are illustrative merely and that various modifications and changes can be made in the structure and methods disclosed without departing from the spirit of the invention.

Like numerals refer to like parts throughout the several views.

DESCRIPTION OF THE PREFERRED EMBODIMENT

Referring now more particularly to the drawings, in which a preferred embodiment of apparatus for practicing the methods of the present invention is illustrated, a vacuum furnace is provided preferably having a cylindrical wall or shell 10 closed at the rear end in any desired manner, such as by an end closure plate 11. A door 12 is provided, hingedly mounted by hinges 13 on the wall 10 and movable to closing position with respect to the front end flange 14 of the shell 10. Suitable vacuum tight packing (not shown) is interposed between the door 12 and the end flange 14 on the wall 10.

The shell 10 can be supported in any desired manner, such as by supports 15 with suitable intermediate bracing 16.

A vacuum chamber 20 is thus provided within the shell 10, the closure wall 11 and the door 12. The door 12 may be provided with a sighting port 21 to permit observation of the interior of the chamber 20 during processing.

Within the shell 10 a cylindrical ring heat shield 22 is provided for reflecting heat inwardly within the shell 10 and reducing heat leakage outwardly.

Within the shield 22 a plurality of spaced alloy metal strip type heating elements 24 are provided preferably disposed from end to end within the chamber 20. The heating elements 24 are supported in any desired manner and are provided with conductors 25 and 25a extending through sealing bushings 26 in the shell 10 for activation when desired.

The door 12 may also be provided with a heat shield and with heating elements (not shown) if desired.

Within the chamber 20 and inwardly of the shield 22 and heating elements 24, a horizontal work support 23 is provided, supported from the bottom of the shell 10 by vertical supporting pins 27 and horizontal supporting rails 28 on which the work pieces 30 are supported. If desired, and dependent on the nature of the work pieces 30, they may be stacked in tiers with ceramic insulators 31 for separation thereof.

The chamber 20 is provided with a vacuum pump 33 for evacuation of the chamber 20 connected to an opening in shell 10 by a pipe 34 with a vacuum roughing valve 35 interposed in the pipe 34 and with a pipe 36 bypassing the roughing valve 35 and having a manually controlled bypass valve 37 therearound.

A source of gas 40, such as a gas bottle, is provided. The gas can be a suitable gas, such as nitrogen, where a nitride case is desired, or can be a hydrocarbon gas such as methane, if a carburized case is desired. Mixtures of gases can also be employed if a composite case is desired. The gas bottle 40 is connected to the chamber 20 preferably through a pressure regulator 41 and a solenoid controlled valve 42 and by a pipe 43 to the interior of the chamber 20. An adjustable needle valve 44 is provided in the pipe 43 to trim the gas from the bottle 40 to the desired partial pressure as indicated by a pressure gage 45.

Provisions are made for the introduction of cooling gas into the chamber 20 to shorten the time required for each cycle and for this purpose a cooling gas supply pipe 48 is provided through which any desired cooling gas under pressure, including air, can be supplied in the quantity desired for charging the cooling system. A valve 49 is provided to shut off the supply. The pipe 48 is connected to a pipe 50 which has a heat exchanger 51 therein for cooling the gas. The heat exchanger 51 can have cooling fluid inlet and outlet pipes 52 and 53. The pipe 50 extends to a blower 54 for supplying the cooled gas through a pipe 55 to a manifold 56. From the manifold 56 a plurality of curved pipes 57 are disposed at the spaces between the heating elements 24 with cool gas delivery pipes 58 for delivery of cool gas into the chamber 20.

A return pipe 59 extending through the shell 10 is connected to the pipe 50 for circulation of the gas through the heat exchanger 51. Isolating valves 46 and 47 may be provided to shut off any flow to or from the chamber 20.

In using the equipment for ion carburizing the work pieces can be transferred to a separate chamber and lowered into a liquid quenching medium.

Referring now more particularly to FIG. 1 the power supply for ionization and auxiliary heating is there shown.

Power leads 60 and 61 are connected to an alternating current source, the leads 60 and 61 being connected to the primary of a step-down transformer 62 with a saturable core reactor 63. The secondary of the transformer is connected by power leads 64 and 65 to the conductors 25 and 25a for furnace heating.

A furnace temperature control thermocouple 68 is provided within the chamber 20 and is connected by lead wires 69 which extend through a gas tight bushing 70 in the shell wall 10 and to a temperature recording controller 71 which has a conductor 72 extending to saturable core reactor 63 for controlling the current delivery to the transformer 62 in accordance with the temperature prevailing in the chamber 20.

Overheat temperature protection can be provided by a thermocouple 73 connected by conductors 74 extending through a gas tight bushing 70 to an overheat controller 75 which is connected by a conductor 76 to a power control relay 77 for shutting off current flow at a selected temperature level.

A high voltage direct current supply is provided for gas ionization.

For this purpose, the power leads 60 and 61 have conductors 80 and 81 connected thereto which are connected to the primary winding of a step up transformer 82. The secondary winding of the transformer 82 has its terminals connected by conductors 83 and 84 to a bridge rectifier 85 to provide a full wave rectified voltage through conductors 86 and 87. The conductor 87 is connected to the wall or shell 10 which is preferably connected to ground for safety.

The conductor 80 is connected through a saturable core reactor 90 with an adjustable power controller 91 which regulates the output of the reactor 90 through a current transformer 92. The power controller 91 is energized from a current transformer 93 located in the conductor 80.

A DC voltmeter 95 is provided across the conductors 86 and 87 and a DC ammeter 96 is provided in series in the conductor 86.

A pressure indicator 97 in Torr units of pressure is provided connected by a conduit 98 to the interior of the chamber 20 and through a conductor 99 controls the solenoid valve 42.

The mode of operation will now be pointed out.

The work pieces 30 to which the case is to be applied are mounted in the chamber 20, supported on the work support 23 with the conductor 86 connected thereto. The conductor 87 is connected to the shell 10 for utilization of the potential difference for ionization as referred to below.

The chamber door 12 is closed and sealed and the chamber 20 is evacuated by operation of the vacuum pump 33 to reduce the internal pressure to a level suitable for gas ionization.

When the desired vacuum has been attained in the chamber 20 gas is supplied from the gas bottle 40. This gas may be any suitable gas such as nitrogen if a nitrided case is desired, or can be a hydrocarbon, such as methane, if a carburized case is desired or can be mixtures if a composite case is desired.

The potential difference between that of the shell 10 and the work pieces 30, in the presence of an ionized gas can be utilized for heating the work pieces 30. If the work pieces have large masses the heating may be slow and it is preferred that, in addition to the heating attendant upon the ionization, auxiliary heating be employed. The heating units 30, energized as pointed out above can be used prior to the introduction of the gas or during ion activity and are effective for heating the interior of the chamber 20 to heat the work pieces 30 so that they are more quickly brought to and maintained at the reaction temperature.

When the case formation of the desired depth has been effected the interior of the chamber 20 can be cooled for the purpose of shortening the length of the cycle for ion nitriding or for quenching for carburizing and for such cooling with valves 46 and 47 in their open positions, the cooling gas of the desired composition is circulated by the blower 54 to the manifold 56, through the pipes 57 and the delivery pipes 58 and returned through the heat exchanger 51 for cooling.

The use of the auxiliary heating of the interior of the chamber 20 and the work pieces 30 therein, over and above the heating by the ion activity materially speeds up the heating phase of the cycle. For ion nitriding temperatures of the order of 650° to 1100° F. are required while for carburizing the required temperatures are of the order of 1650° to 1900° F.

The use of the cooled gas materially speeds up the cooling phase of the cycle.

The heating and cooling of the work pieces 30 as herein set forth results in substantial time savings and reduction in energy requirements. The conditions prevailing in the chamber 20 are available to the operator and controlled.

We claim:

1. Apparatus for forming a case on a ferrous object which comprises
    a vacuum chamber having an enclosing wall and a plurality of electric resistance heating elements therein spaced inwardly from said wall and surrounding a work space,
    means for supplying an ionizable gas into said chamber,
    means for applying an electrical potential between a work piece supported interiorly of said heating elements and said chamber for ionizing of the gas and heating of the work piece, and
    means comprising said resistance heating elements supplying heat to the interior of said chamber for heating the work piece in predetermined relation to the application of said electrical potential.

2. Apparatus as defined in claim 1 in which
    cooling fluid supplying means is provided for supplying cooling fluid to the interior of the chamber to lower the temperature of the work piece.

3. Apparatus as defined in claim 2 in which
    said cooling fluid supplying means comprises a closed circuit with a positive gas circulatng member and a heat exchanger for cooling the gas being supplied.

4. Apparatus as defined in claim 1 in which
    the means for supplying an ionizable gas includes a source of nitrogen containing gas.

5. Apparatus as defined in claim 1 in which
    the means for supplying an ionizable gas includes a source of carbon containing gas.

6. Apparatus as defined in claim 1 in which
    valve means is provided for the control of the supply of said ionizable gas, and
    control means responsive to the pressure in said chamber is provided for controlling said valve means.

7. Apparatus as defined in claim 1 in which
    power supply leads are provided, and
    said means for applying said electrical potential comprises a rectifier to which current is supplied from said power supply leads.

8. Apparatus as defined in claim 7 in which
    a step up transformer is provided in advance of said rectifier.

9. Apparatus as defined in claim 7 in which
    control means is provided in advance of said rectifier for controlling the current supply to said rectifier.

10. Apparatus as defined in claim 1 in which
    control means is provided in advance of said means for supplying heat to said chamber responsive to the temperature in said chamber.

11. Apparatus as defined in claim 1 in which
    power supply leads are provided,
    said means for supplying an electrical potential is connected to said power supply leads, through a rectifier, and
    said means for supplying additional heat to said chamber is connected to said power supply leads.

12. Apparatus as defined in claim 1 in which
    a continuously controlled power supply is provided in advance of said means for supplying heat to said chamber.

* * * * *